United States Patent
Kim

(10) Patent No.: US 8,035,442 B2
(45) Date of Patent: Oct. 11, 2011

(54) SEMICONDUCTOR DEVICE

(75) Inventor: Ji-Hyun Kim, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 445 days.

(21) Appl. No.: 11/645,949

(22) Filed: Dec. 27, 2006

(65) Prior Publication Data

US 2008/0122521 A1    May 29, 2008

(30) Foreign Application Priority Data

Aug. 31, 2006  (KR) ................. 10-2006-0083736

(51) Int. Cl.
*H03K 3/01* (2006.01)
(52) U.S. Cl. .................... 327/537; 327/589; 327/536
(58) Field of Classification Search .......... 327/534–537, 327/589
See application file for complete search history.

(56) References Cited

U.S. PATENT DOCUMENTS

| 5,541,529 | A | * | 7/1996 | Mashiko et al. | ............... 326/39 |
| 5,877,635 | A | * | 3/1999 | Lin | .................................. 326/83 |
| 6,023,187 | A | * | 2/2000 | Camacho et al. | ............. 327/536 |
| 6,154,088 | A | * | 11/2000 | Chevallier et al. | ............. 327/536 |

FOREIGN PATENT DOCUMENTS

KR    10-2005-0079179    8/2005

* cited by examiner

*Primary Examiner* — Dinh T. Le
(74) *Attorney, Agent, or Firm* — Blakely, Sokoloff, Taylor & Zafman

(57) ABSTRACT

A semiconductor device including a pumping capacitor for inducing a high voltage, a switching circuit for transferring the high voltage induced by the pumping capacitor and a switching control circuit for controlling the switching circuit, wherein the switching control circuit includes a first capacitor for inducing a switching control voltage to a first node in response to an oscillation signal, a first switching MOS transistor for transferring the switching control voltage applied to the first node to a second node, and a first turn-on controller for maintaining the first switching MOS transistor to be turned on, and allowing a voltage below a predetermined voltage difference to be applied between the first node and a gate of the first switching MOS transistor.

16 Claims, 15 Drawing Sheets

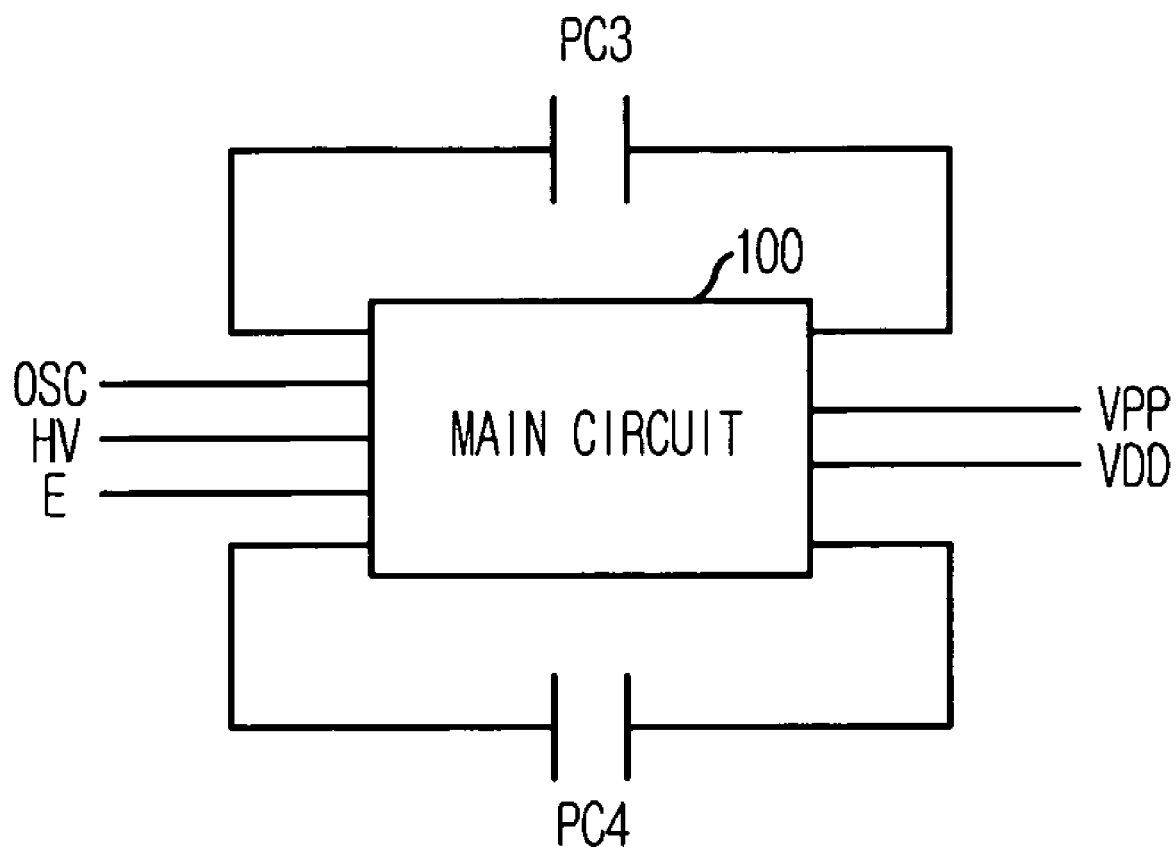

<WAVEFORMS WHERE OPERATED NORMALLY>

<WAVEFORMS WHERE OPERATED ABNORMALLY>

SEMICONDUCTOR DEVICE

CROSS-REFERENCE TO RELATED APPLICATION

The present invention claims priority of Korean patent application number 10-2006-0083736, filed on Aug. 31, 2006, which is incorporated by reference in its entirety.

BACKGROUND OF THE INVENTION

The present invention relates to a semiconductor device; and, more particularly, to a high voltage generation circuit for use in the semiconductor device.

As well-known in the art, a semiconductor memory device is a semiconductor device that stores a lot of data and reads out the stored data. In order to effectively store and read out a lot of data, the semiconductor memory device generates various internal voltages required for its internal operation by using a power supply voltage and a ground voltage provided from outside. For example, as the internal voltages, there are a core voltage used as a driving voltage in a data storage area in which a lot of data are stored, a driving voltage for peripheral areas used in peripheral areas for outputting the data stored in the data storage area outside or providing data received from the outside thereto, and a high voltage and a low voltage used for effective control of a MOS transistor arranged in the data storage area. Among these voltages, the high voltage generally refers to a voltage having a level higher than that of a power supply voltage by a certain level. This high voltage is mainly provided to a gate of the MOS transistor disposed in the data storage area. On the other hand, the low voltage generally refers to a voltage having a level lower than that of a ground voltage by a certain level. This low voltage is mainly used as a bulk voltage of the MOS transistor in the data storage area.

A conventional high voltage generation circuit generates a high voltage that is twice or thrice as high as a level of a power supply voltage by employing the power supply voltage and a ground voltage. It is a tendency that a level of the power supply voltage is gradually being lowered to reduce the power consumption of a semiconductor memory device. Meanwhile, the level of the high voltage generated by the high voltage generation circuit should be constantly maintained in order to drive the MOS transistor arranged in the data storage area. Therefore, the high voltage generation circuit generates a high voltage that is twice as high as the power supply voltage if it can provide the required level of high voltage by boosting the power supply voltage two times. Alternatively, it generates a high voltage that is thrice as high as the power supply voltage if it can provide the required level of high voltage by boosting the power supply voltage three times.

Accordingly, a plurality of MOS transistors arranged in the high voltage generation circuit should be connected to a node in which a voltage level that is twice or thrice as high as the level of the power supply voltage is provided. Since the MOS transistors disposed in the semiconductor memory device are designed to be smaller with the advancement of technologies of semiconductor integration circuits, it is inevitable that they are further weakened as a voltage level is higher than before. Specifically, since the gate length of MOS transistors is shorter, they are further weakened to a higher voltage. It is very difficult for the smaller MOS transistors of the high voltage generation circuit to operate stably when they receive a high voltage that is twice or thrice as high as the power supply voltage. Moreover, in a serious case, these MOS transistors are destroyed.

An example of solving the above problems is that high voltage generation circuits for generating high voltages that are twice and thrice as high as the level of the power supply voltage respectively are disposed separately. In this case, the MOS transistors arranged in the high voltage generation circuits are designed to be different from each other. However, this enlarges the size of a whole circuit to generate the high voltage, and in turn increases power consumption.

SUMMARY OF THE INVENTION

It is, therefore, a primary object of the present invention to provide a high voltage generator for use in a semiconductor device, which is capable of more stably generating a high voltage by maximally reducing a variation of voltage applied to MOS transistors provided therein.

In accordance with one aspect of the present invention, there is provided a semiconductor device including a pumping capacitor for inducing a high voltage, a switching circuit for transferring the high voltage induced by the pumping capacitor and a switching control circuit for controlling the switching circuit, wherein the switching control circuit includes: a first capacitor for inducing a switching control voltage to a first node in response to an oscillation signal; a first switching MOS transistor for transferring the switching control voltage applied to the first node to a second node; and a first turn-on controller for maintaining the first switching MOS transistor to be turned on, and allowing a voltage below a predetermined voltage difference to be applied between the first node and a gate of the first switching MOS transistor.

In accordance with another aspect of the present invention, there is provided a semiconductor device including a first capacitor for inducing a first high voltage, a first switching circuit for transferring the first high voltage induced by the first capacitor to a first node, a second capacitor for inducing a second high voltage to the first node, a second switching circuit for outputting the second high voltage induced by the second capacitor, a first switching control circuit for controlling the first switching circuit, and a second switching control circuit for controlling the second switching circuit, wherein the first switching control circuit includes: a third capacitor for inducing a first switching control voltage to a third node in response to an oscillation signal; a first switching MOS transistor for transferring the first switching control voltage applied to the third node to a second node; a fourth capacitor disposed between a fourth node and the switching circuit; a second switching MOS transistor disposed between the fourth node and a ground voltage; a first turn-on controller for maintaining the first switching MOS transistor to be turned on, and allowing a voltage level below a predetermined voltage level to be applied between the first node and a gate of the first switching MOS transistor; and a second turn-on controller for allowing a voltage level below a predetermined voltage level to be applied between the first node and a gate of the second switching MOS transistor, and the second switching control circuit includes: a fifth capacitor for inducing a second switching control voltage to the fourth node in response to the oscillation signal; a third switching MOS transistor for transferring the second switching control voltage applied to the fourth node; a sixth capacitor disposed between the fourth node and the second switching circuit; a fourth switching MOS transistor disposed between the fourth node and the ground voltage; a third turn-on controller for maintaining the third switching MOS transistor to be turned on, and allowing a voltage level below a predetermined voltage level to be applied between the third node and a gate of the third switching MOS transistor; and a fourth turn-on controller for allowing a voltage level below a predetermined voltage level to be applied between the third node and a gate of the fourth switching MOS transistor.

In accordance with a further another aspect of the present invention, there is provided a method for driving a semiconductor device including a capacitor for inducing a high voltage to generate the high voltage, a transfer transistor for transferring the high voltage induced by the capacitor and a control transistor for controlling the transfer transistor, the method including the steps of: applying a first turn-on voltage to the control transistor; applying a first voltage to one terminal of the control transistor; applying a second turn-on voltage having a level higher than that of the first turn-on voltage to the gate of the control transistor; boosting the first voltage applied to one terminal of the control transistor to a second voltage; transferring the second voltage to the other terminal of the control transistor; and turning on the transfer transistor by using the second voltage transferred to the other terminal of the transfer transistor.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

FIG. 6 is a block diagram illustrating a high voltage generation circuit for use in a semiconductor device in accordance with a preferred embodiment of the present invention.

DESCRIPTION OF SPECIFIC EMBODIMENTS

Hereinafter, preferred embodiments of the present invention will be set forth in detail with reference to the accompanying drawings to the extent that those skilled in the art can easily carry out the invention.

As will be described below, the present invention provides a high voltage generation circuit capable of reliably generating a high voltage by reducing a stress applied to MOS transistors by way of preventing a high voltage from being taken between terminals of the MOS transistors of an internal circuit in the process of generating the high voltage.

Figure 1:
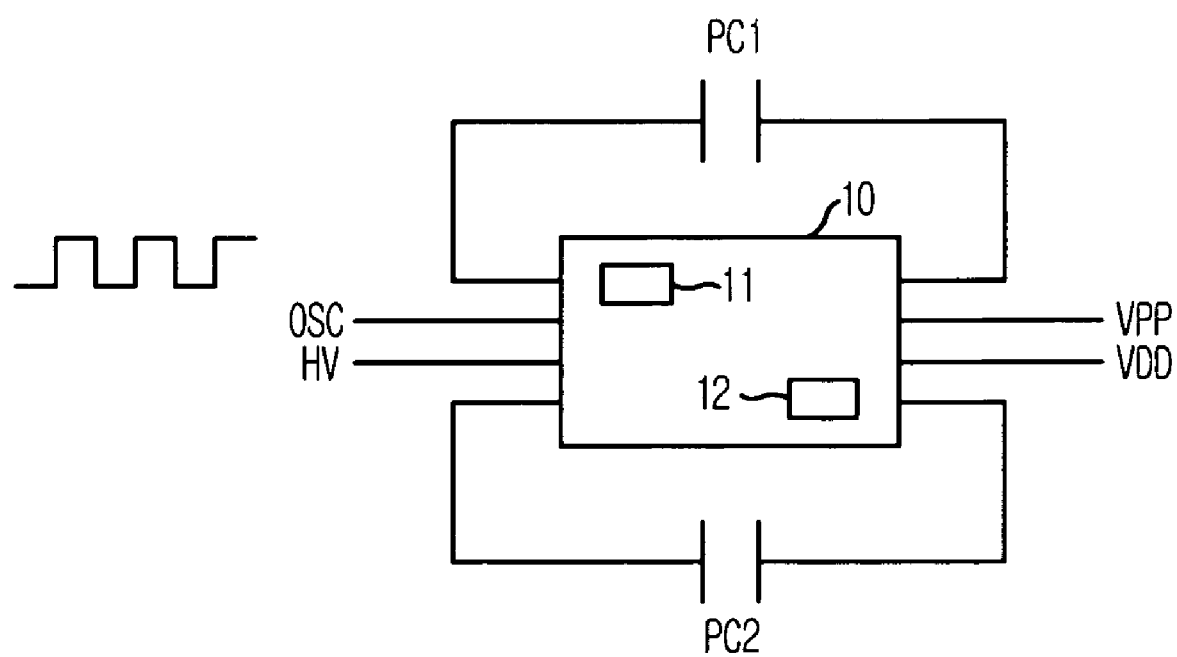
FIG. 1 is a block diagram illustrating a high voltage generation circuit for use in a semiconductor device.

FIG. 1 is a block diagram illustrating a high voltage generation circuit for use in a semiconductor device.

Referring to FIG. 1, the high voltage generation circuit includes charge capacitors PC1 and PC2, and a main circuit 10 which takes an oscillation signal OSC and a control signal HV, controls the charging and discharging operations of the charge capacitors PC1 and PC2 and outputs a high voltage VPP generated by the above operations. The oscillation signal OSC is a signal that is being oscillated and inputted, and the control signal HV is a signal for controlling whether to provide the high voltage VPP as a voltage level that is twice or thrice as high as a power supply voltage VDD. And, provided in the main circuit 10 are switching control circuits 11 and 12 which serve to switch a delivery of the high voltage to each of the charge capacitors PC1 and PC2 in the course of generating the high voltage.

Figure 2:
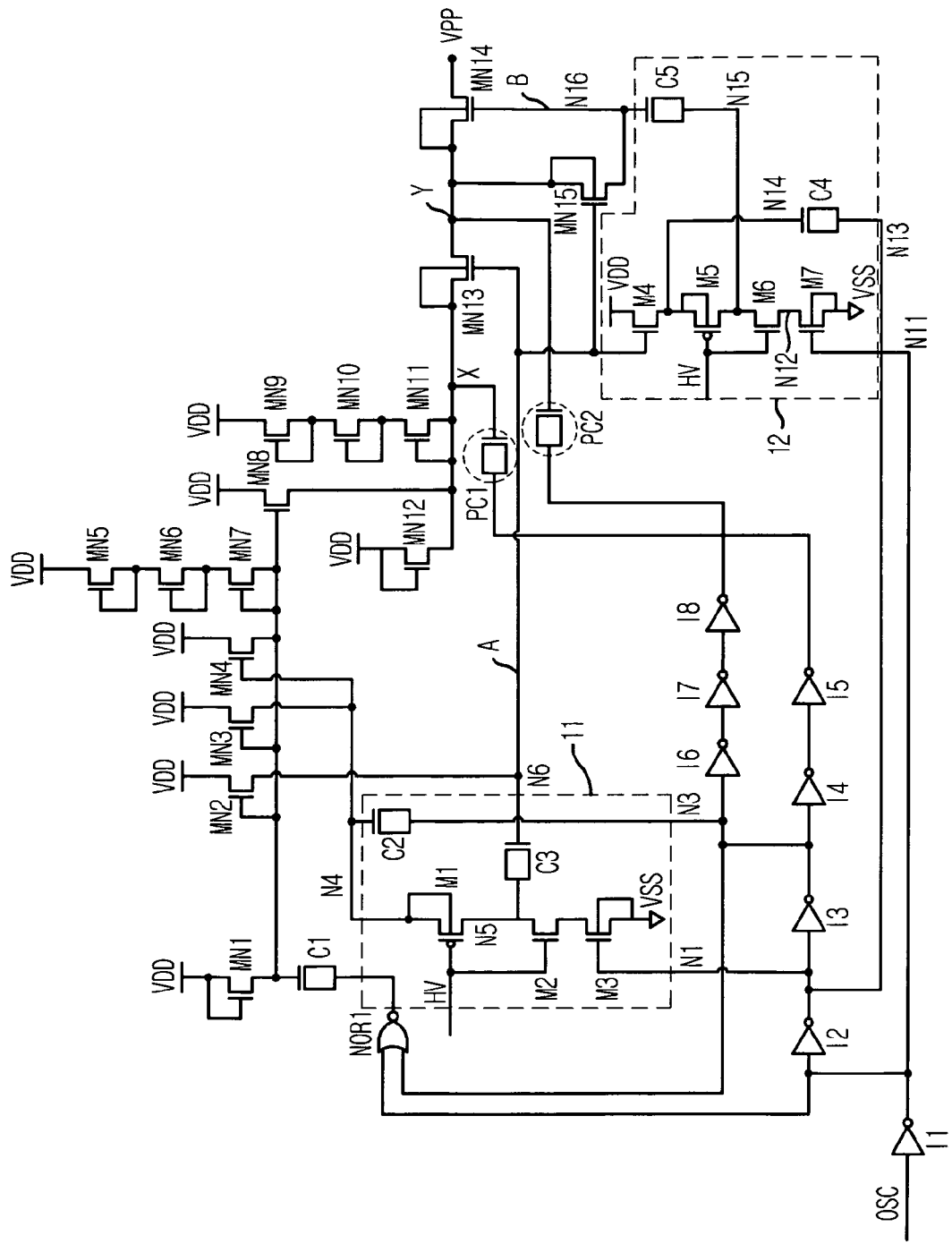
FIG. 2 illustrates a circuit diagram of the high voltage generation circuit shown in FIG. 1.

FIG. 2 illustrates a circuit diagram of the high voltage generation circuit shown in FIG. 1.

Referring to FIG. 2, the high voltage generation circuit is provided with charge capacitors PC1 and PC2, MOS transistors MN1 to MN15, inverters I1 to I8, switching control circuits 11 and 12, a capacitor C1, and a NOR gate NOR1.

The charge capacitors PC1 and PC2 are to induce a high voltage that corresponds to the power supply voltage or a multiple thereof to output the high voltage. The NOR gate NOR1, the capacitor C1 and the MOS transistors MN1 to MN11 are devices for setting an initial value applied to a common node X of the charge capacitor CP1 and the MOS transistor MN13. The switching control circuit 11 is to control the switching MOS transistor MN13, while the switching control circuit 12 is to control the switching MOS transistor MN14. The inverters I1 to I8 are devices for controlling the charge capacitors PC1 and PC2 so that they can perform the charging and discharging operations in response to the oscillation signal OSC. The switching control circuits 11 and 12 are alternately operated in response to the oscillation signal OSC.

Further, the control signal HV is a signal for deciding whether the high voltage generation circuit as shown in FIG. 2 will be used as a doubler or tripler. The decision on the above is made based on a level of an operating voltage of a semiconductor memory device. For example, when the operating voltage is 3.3 V in a semiconductor memory device that can use both 3.3 V and 1.8 V as its operating voltage, the high voltage generation circuit is operated as a doubler. And, when the operating voltage is 1.8 V, the high voltage generation circuit is operated as a tripler. When the high voltage generation circuit is operated as the doubler, the control signal HV is maintained at a logic low level, and when the high voltage generation circuit is operated as the tripler, the control signal HV is kept at a logic high level.

In succession, an example of having the high voltage generation circuit operated as a tripler will be described. First of all, a power supply voltage VDD is applied to the node X by the capacitor PC1 and the MOS transistor MN13 for setting an initial value. Next, when an output signal of the inverter I5 connected to one side of the charge capacitor PC1 is transited from (or toggled between) the power supply voltage VDD to a ground voltage VSS, and vice versa, a voltage at the node X is boosted to 2VDD by the charging and discharging operations of the charge capacitor PC1.

Thereafter, when the MOS transistor MN13 is turned on by a switching signal A outputted from the switching control circuit 11, the boosted voltage 2VDD of the node X is conveyed to a node Y. The switching signal A should be kept at a high voltage level that adds a threshold voltage level of the MOS transistor MN13 to the boosted voltage 2VDD of the node X so as to transfer the boosted voltage 2VDD of the node X to the node Y without any loss.

And then, when an output signal of the inverter I8 connected to one side of the charge capacitor PC2 is transited from (or toggled between) the power supply voltage VDD to the ground voltage VSS, and vice versa, a voltage at the node Y is boosted to 3VDD by the charging and discharging operations of the charge capacitor PC1. Subsequently, when the MOS transistor MN14 is turned on by a switching control signal B provided by the switching control circuit 12, the boosted voltage 3VDD at the node Y is outputted as the high voltage. The switching signal A should be maintained at a high voltage level that adds a threshold voltage level of the MOS transistor MN14 to the boosted voltage 3VDD at the node Y so as to provide the boosted voltage 3VDD of the node Y as the high voltage VPP without any loss.

When the high voltage generation circuit is used as the doubler, the boosted 2VDD is induced to the node X and then provided as the high voltage VPP via the node Y.

Figure 3A:
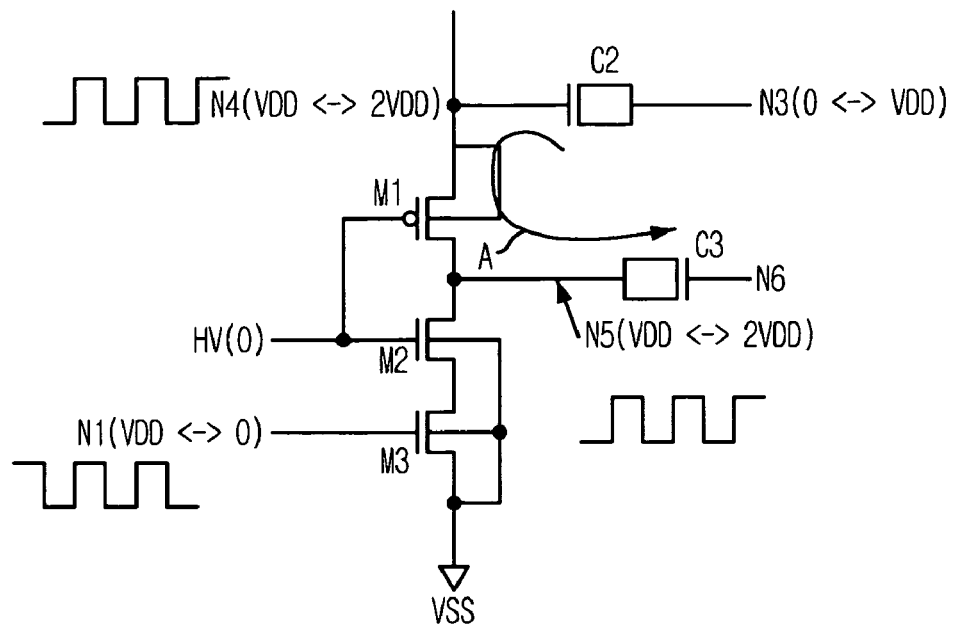
FIGS. 3A and 3B illustrate circuit diagrams of the first and the second switching control circuits shown in FIG. 2, respectively.
Figure 3B:
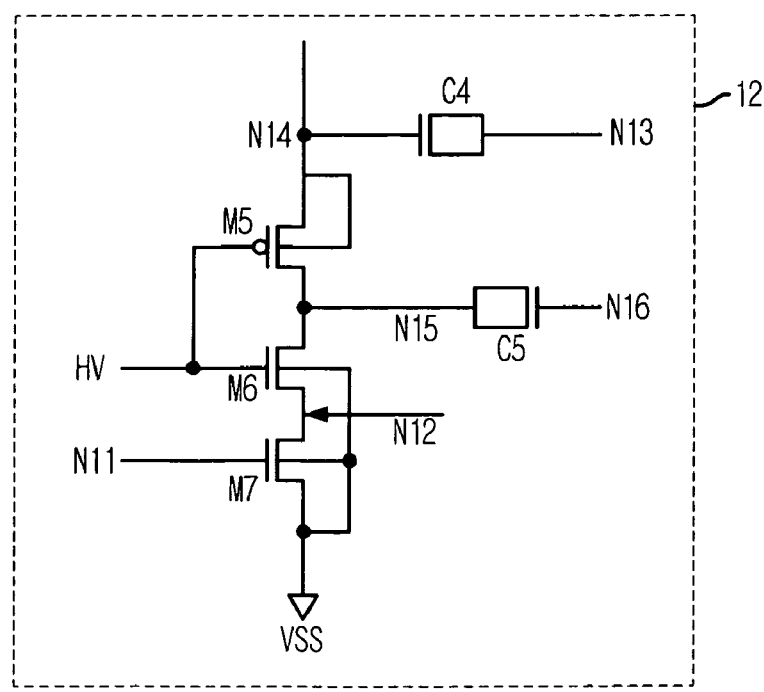
Figure 4A:
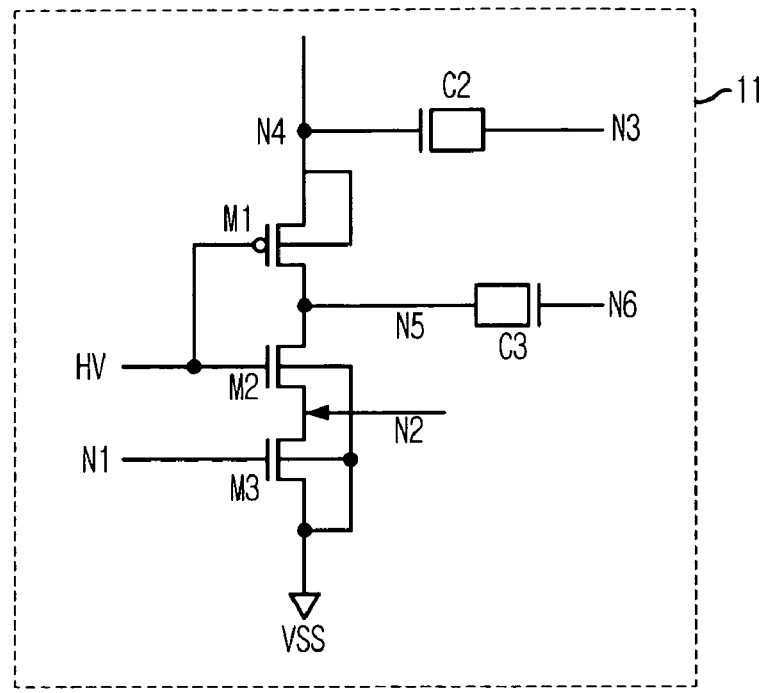
FIGS. 4A and 4B are circuit diagrams for describing the operation of the first switching control circuit shown in FIG. 2.
Figure 4B:
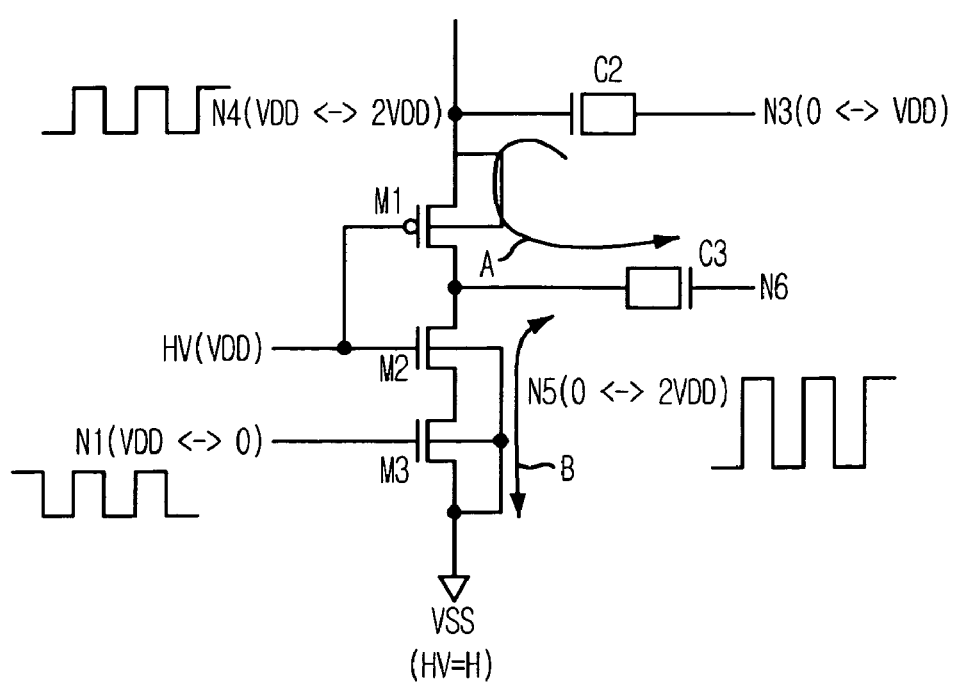
Figure 5A:
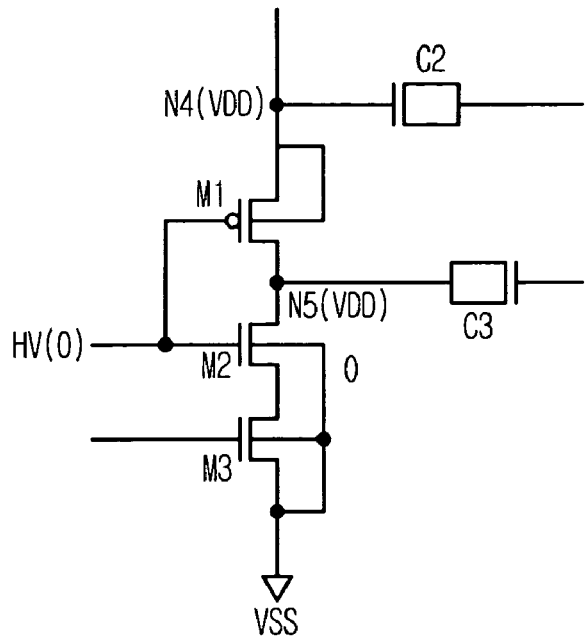
FIGS. 5A and 5B are equivalent circuit diagrams for describing the operation of the first switching control circuit shown in FIG. 2.
Figure 5B:
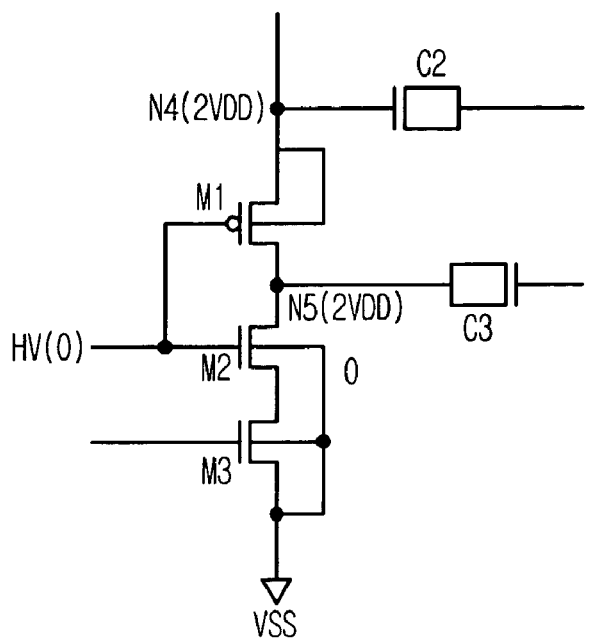

FIGS. 3A and 3B illustrate circuit diagrams of the first and the second switching control circuits shown in FIG. 2 respectively, FIGS. 4A and 4B are circuit diagrams for describing the operation of the first switching control circuit shown in FIG. 2, and FIGS. 5A and 5B are equivalent circuit diagrams for describing the operation of the first switching control circuit shown in FIG. 2. In the figures, FIG. 4A shows a circuit diagram when the high voltage generation circuit shown in FIG. 2 is operated as a doubler, and FIG. 4B shows a circuit diagram when it is operated as a tripler.

First, in case where it is operated as the doubler, the control signal HV applied to the switching control circuit 11 is a logic low level. Thus, a MOS transistor M1 is turned on and a MOS transistor M2 is turned off, thereby delivering a voltage level at a node N4 to a node N5. In response to the oscillation signal OSC, outputs of the inverters I2 and I3 are toggled, and thus, a voltage at a node N3 is toggled between the ground voltage and the power supply voltage. A voltage at a node N5 is also changed to the same voltage level as the voltage level at the node N4. Also, a voltage at a node N1 is toggled between the power supply voltage and the ground voltage, but does not affect the node N5 since the MOS transistor M2 is in a turn-off state.

Next, in case where it is operated as the tripler, the control signal HV applied to the switching control circuit 11 is a logic high level. According to this, the power supply voltage is applied to a gate of the MOS transistor M1. Therefore, when the voltage at the node N4 is the power supply voltage VDD, the MOS transistor M1 becomes turned off. When the voltage at the node N4 is the boosted voltage 2VDD, the MOS transistor M1 becomes turned on, thereby making the MOS transistor M2 turned on by applying the power supply voltage to its gate. Since a gate of the MOS transistor M3 takes the output signal of the inverter I2 being toggled by the oscillation signal, it is fluctuated between the power supply voltage and the ground voltage.

The voltages at the nodes N4 and N1 are fluctuated between different levels, respectively. That is, when the voltage level at the node N4 has risen from VDD to 2VDD, the voltage at the node N1 will drop from VDD to VSS. When the voltage at the node N4 has dropped from 2VDD to VDD, the voltage at the node N1 will rise from VSS to VDD. When the voltage at the node N4 is toggled between 2VDD and VDD, the voltage at the node N5 is toggled from VSS to 2×VDD. When the voltage at a node N4 is VDD, the MOS transistor M1 is turned on and the MOS transistors M2 and M3 are in a turn-on state, thereby making the voltage at the node N5 drop to VSS. When the voltage at the node N4 is 2VDD, the MOS transistors M1 and M2 are turned on and the MOS transistor M3 is turned off, which delivers 2VDD applied to the node N4 to the node N5.

FIGS. 5A and 5B illustrate equivalent circuit diagrams of the first switching control circuit 11 when the oscillation signal OSC becomes a logic high level and a logic low level in the state that the control signal HV is a logic low level. Namely, FIG. 5A represents that the oscillation signal OSC is a logic high level if the control signal HV is a logic low level and FIG. 5B represents that the oscillation signal OSC is a logic low level if the control signal HV is low level.

In this case, one problem is associated with voltages applied to each terminal of the MOS transistors constituting the switching control circuit 11. In other words, in case where the high voltage generation circuit is operated as the tripler, since a 2VDD voltage level is not high due to low VDD itself, a serious problem does not occur although a 2VDD voltage difference exists between the gate of the MOS transistor M1 and its one terminal. But, in case where the high voltage generation circuit is operated as the doubler, there may be a problem if the 2VDD voltage difference exists between the gate of the MOS transistor M1 and its one terminal, even in 2VDD only. For example, when the power supply voltage VDD is 1.8 V and thus the high voltage generation circuit is operated as the tripler, 3.6 V (1.8 V×2) is applied between the gate of the MOS transistor M1 and its one terminal. And, when VDD is 3.3 V and thus the high voltage generation circuit is operated as the doubler, 6.6 V (3.3 V×2) is applied between the gate of the MOS transistor M1 and its one terminal. Accordingly, too much excessive voltage is supplied between the two terminals of the MOS transistors M1, and thus, stability cannot be guaranteed in operation of the MOS transistor M1.

A voltage capable of maintaining the reliability of the MOS transistor by applying it between the gate and its one terminal is different according to a manufacturing process. But, since a channel width of the MOS transistor is gradually being decreased as the semiconductor memory device is highly integrated in recent years, it becomes very difficult to maintain the reliability of the MOS transistor in operation when an excessive voltage of about 6.6 V is applied between both terminals of the MOS transistor. Therefore, it is required to configure the high voltage generation circuit so that 2VDD is not taken between both terminals of the MOS transistor constituting the high voltage generation circuit.

The present invention proposes a high voltage generation circuit which is configured in a manner that 2VDD is not applied between both terminals of a MOS transistor forming a switching control circuit, and stably operated in such a circuit configuration.

FIG. 6 is a block diagram illustrating a high voltage generation circuit for use in a semiconductor device in accordance with a preferred embodiment of the present invention.

Referring to FIG. 6, the high voltage generation circuit in accordance with this embodiment includes charge capacitors PC3 and PC4, and a main circuit 100 for controlling the charging and discharging operations of the charge capacitors PC3 and PC4. The main circuit 100 receives an oscillation signal OSC, a control signal HV and a power supply voltage VDD, and outputs a high voltage VPP. The control signal HV denotes a signal for controlling whether the high voltage generation circuit will be operated as a doubler or tripler.

Figure 7:
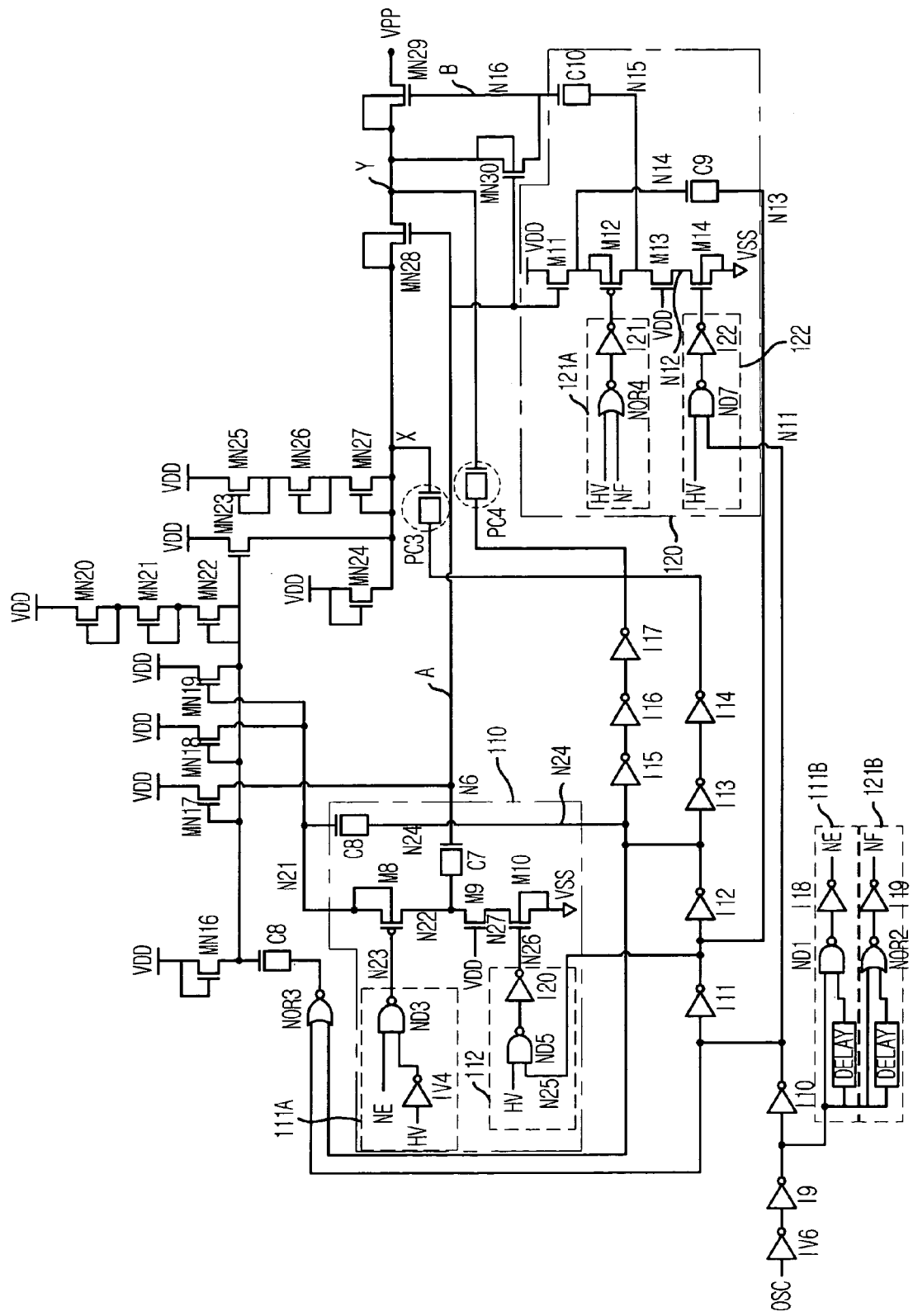
FIG. 7 illustrates a circuit diagram of the high voltage generation circuit shown in FIG. 6.

FIG. 7 illustrates a circuit diagram of the high voltage generation circuit shown in FIG. 6.

Referring to FIG. 7, the high voltage generation circuit is provided with charge capacitors PC3 and PC4, MOS transistors MN16 to MN30, inverters I9 to I17, switching control circuits 110 and 120, a capacitor C8, and a NOR gate NOR3.

The charge capacitors PC3 and PC4 are to induce a high voltage that corresponds to the power supply voltage or a multiple thereof to provide the high voltage. The NOR gate NOR3, the capacitor C8 and the MOS transistors MN16 to MN27 are devices for setting an initial value applied to a common node X of the charge capacitor PC3 and the MOS transistor MN28. The switching control circuit 110 is to control the switching MOS transistor MN28, and the switching control circuit 120 is to control the switching MOS transistor MN29. The switching control circuit 110 is provided with first turn-on controllers 111A and 111B, and a second turn-on controller 112. The switching control circuit 120 is provided with third turn-on controllers 121A and 121B, and a fourth turn-on controller 122.

More specifically, the first turn-on controllers 111A and 111B maintain a turn-on operation of a first switching MOS transistor M8, and allows a voltage below a certain voltage level to be applied between a node N21 and a gate of the first switchimg MOS transistor M8. These first turn-on controller 111A and 111B are provided with a signal generator 111B for generating a reference signal NE whose high level width is larger than that of the oscillation signal OSC, and a transfer circuit 111A for transferring the reference signal NE to the gate of the first switching MOS transistor M8 in response to the control signal HA. The third turn-on controllers 121A and 121B are provided with a signal generator 121B for generating a reference signal NF whose high level width is greater than that of the oscillation signal OSC, and a transfer circuit 121A for transferring the reference signal NF to the gate of a first switching MOS transistor M12 in response to the control signal HA.

The inverters I9 to I17 are devices for controlling the charge capacitors PC3 and PC4 so that they can perform the charging and discharging operations in response to the oscillation signal OSC. The switching control circuits 110 and 120 are configured to alternately operate in response to the oscillation signal OSC. In addition, an oscillation signal generator 111B and 121B receives the oscillation signal and generates the reference signals NE and NF whose high level widths are larger than that of the oscillation signal OSC. The reference signals NE and NF are then provided to the transfer circuits 111A and 12A, respectively.

As mentioned above, the control signal HV is a signal for deciding whether the high voltage generation circuit as shown in FIG. 7 will be used as a doubler or tripler. The decision thereon is made based on a level of an operating voltage of a semiconductor memory device. For example, when the operating voltage is 3.3 V in a semiconductor memory device that can use both 3.3 V and 1.8 V as its operating voltage, the high voltage generation circuit is operated as a doubler. And, when the operating voltage is 1.8 V, the high voltage generation circuit is operated as a tripler. When the high voltage generation circuit is operated as the doubler, the control signal HV is maintained at a logic low level, and when the high voltage generation circuit is operated as the tripler, the control signal HV is maintained at a logic high level.

Figure 8A:
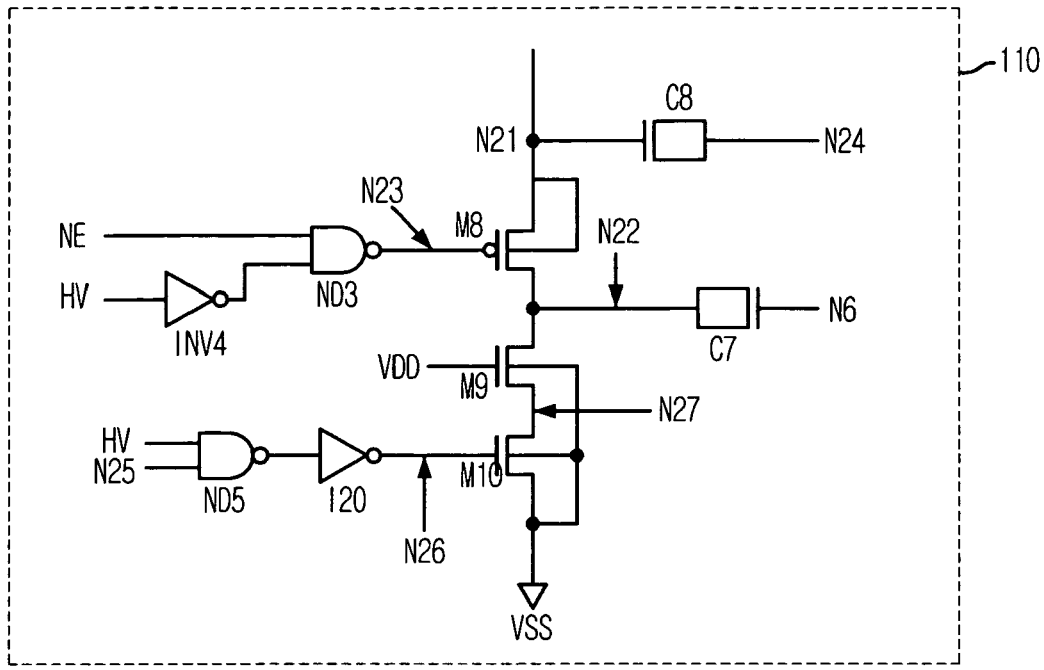
FIGS. 8A and 8B illustrate circuit diagrams of the first and the second switching control circuits shown in FIG. 7 respectively.
Figure 8B:
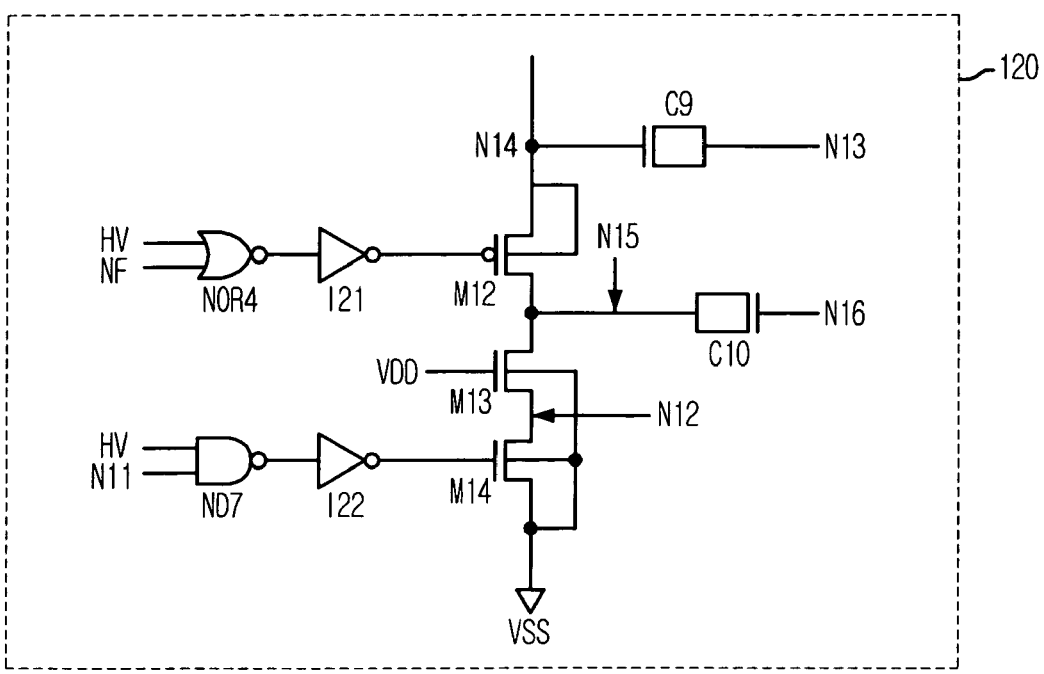
Figure 8C:
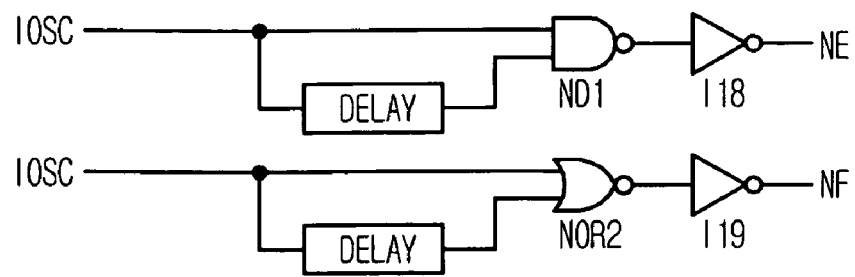
FIG. 8C represents a circuit diagram of the reference signal generator shown in FIG. 7.

FIGS. 8A and 8B illustrate circuit diagrams of the first and the second switching control circuits shown in FIG. 7 respectively, and FIG. 8C represents a circuit diagram of the oscillation signal generator shown in FIG. 7.

Figure 9A:
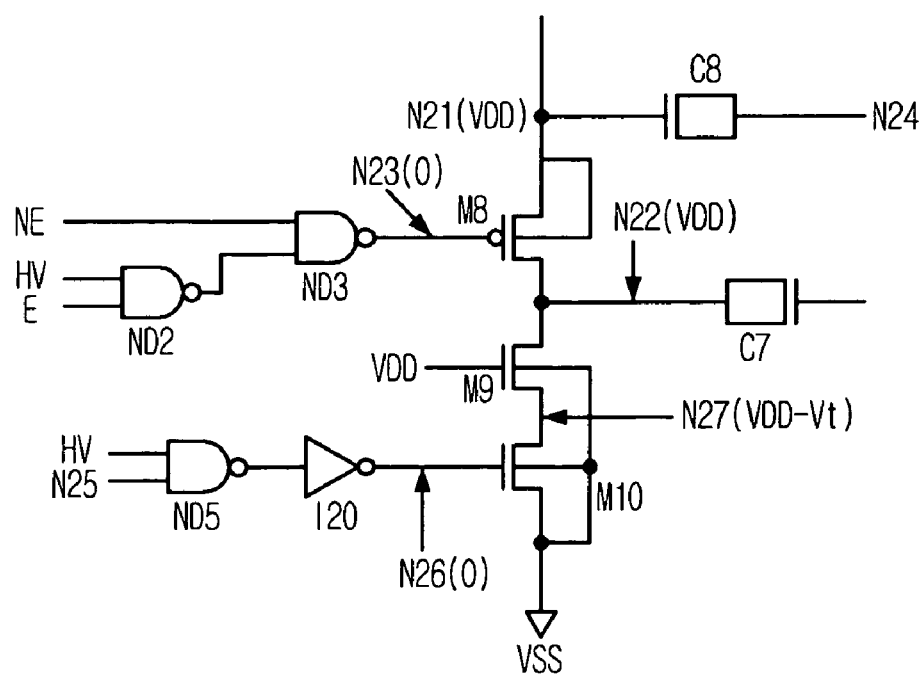
FIGS. 9A to 9C are circuit diagrams for explaining the operation of the first switching control circuit shown in FIG. 7.
Figure 9B:
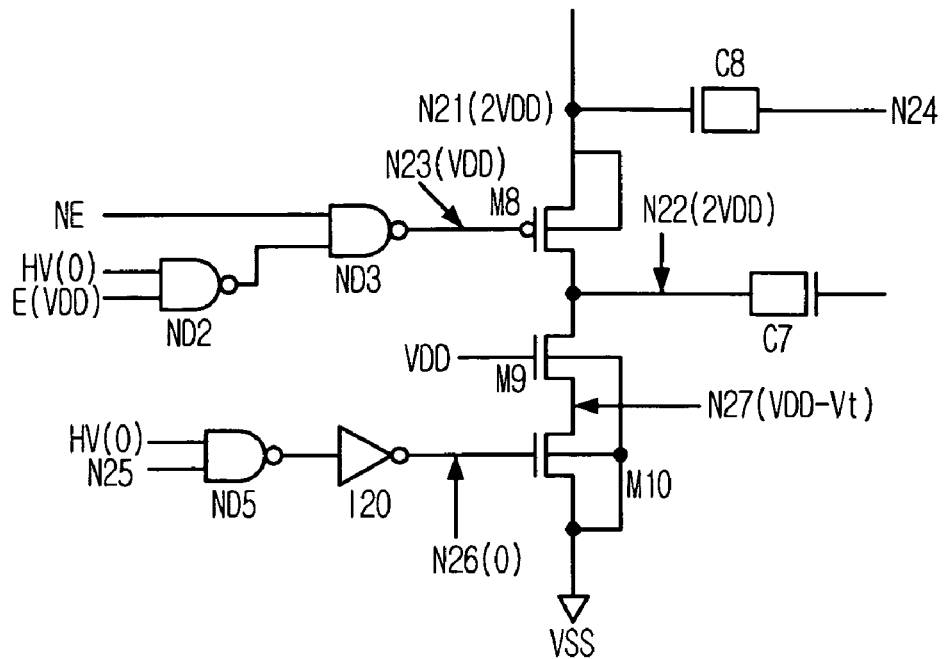
Figure 9C:
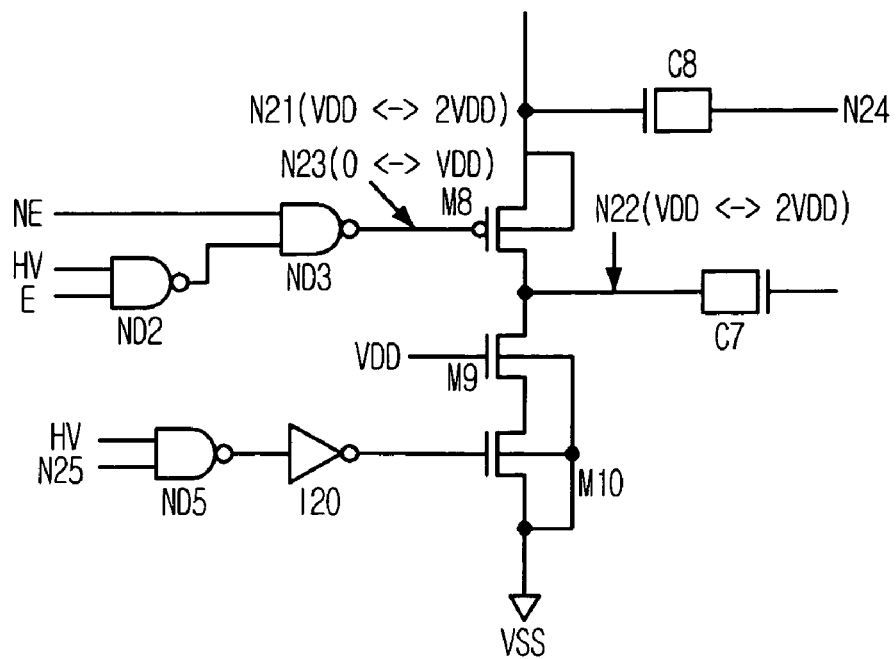
Figure 10A:
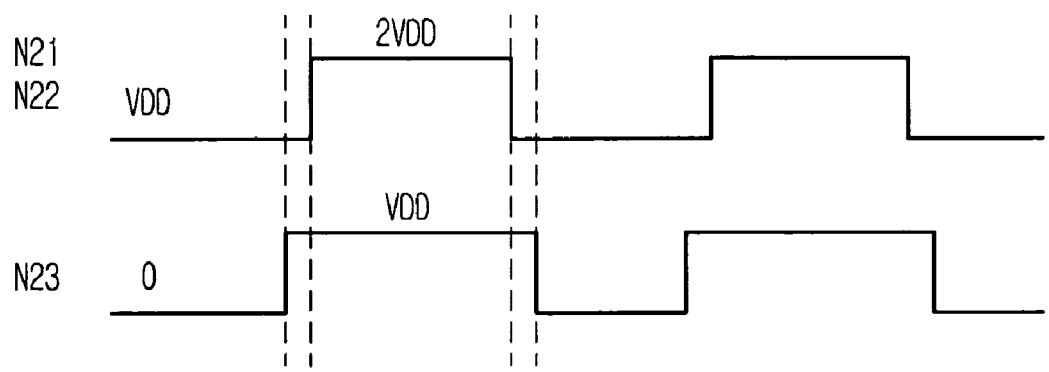
FIGS. 10A to 10C offer waveform diagrams describing the operations of the first switching control circuit and the oscillation signal generator shown in FIG. 7.
Figure 10B:
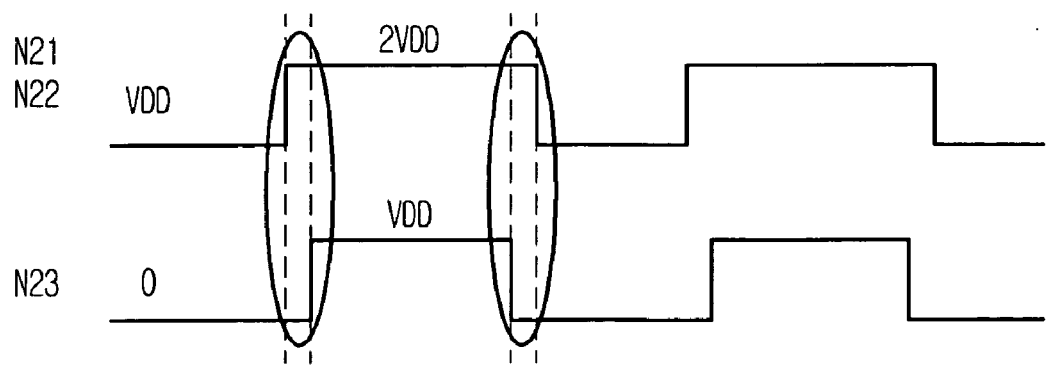
Figure 10C:
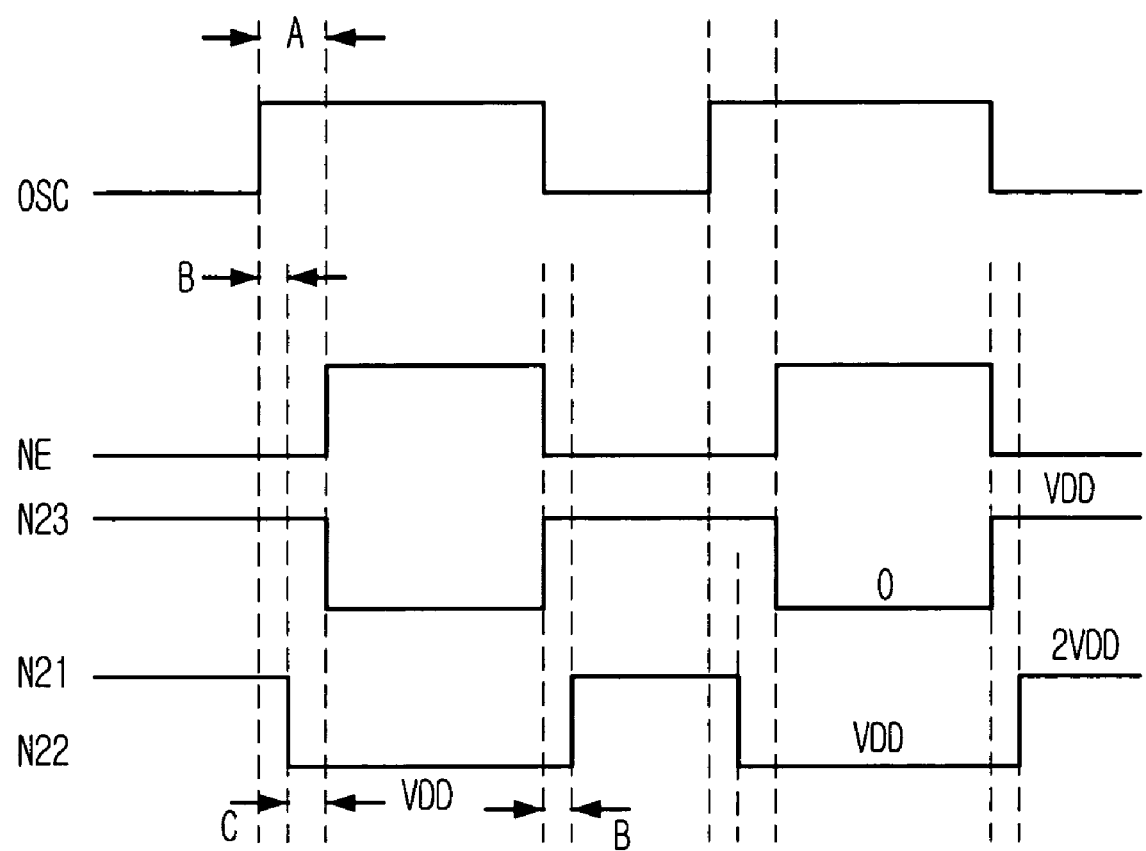

FIGS. 9A to 9C are circuit diagrams for explaining the operation of the first switching control circuit shown in FIG. 7, That is, FIG. 9A is a circuit diagram representing a case where the oscillation signal NE is a logic low level, FIG. 9B shows a circuit diagram representing a case where the oscillation signal NE is a logic high level, and FIG. 9C describes a pulse width of a voltage applied to each node of the switching control circuit 110 when the oscillation signal NE is oscillated. FIGS. 10A to 10C offer waveform diagrams describing the operations of the first switching control circuit and the oscillation signal generator shown in FIG. 7.

When a voltage level at a node N21 is from VDD to 2VDD, the transfer thereof to a node N22 is made by the high voltage generation circuit as shown in FIG. 2. But, at this time, one difference is that 2VDD is not applied between both terminals of the transistor M8, and only VDD is maximally applied therebetween. When VDD is applied to the node N21, the ground voltage VSS is applied to the gate of the MOS transistor M8. When 2VDD is applied to the node N21, VDD is applied to the gate of the MOS transistor M8. Here, the MOS transistor M8 is a P-channel transistor. Therefore, the MOS transistor. M8 can always be kept in a turn-on state regardless of whether VDD or 2VDD is applied to the node N21, thereby transferring the voltage applied to the node N21 to the node N22. Further, since the MOS transistor M9 takes VDD via its gate, it is always maintained in a turn-on state.

Here, one consideration is that a time when a voltage at the node N21 is changed from VDD to 2VDD must be different from a time when a voltage at the node N23 is changed from VSS to VDD. Specifically, the voltage at the node N23 must rise from VSS to VDD prior to letting the voltage level at the node N21 rise from VDD to 2VDD. Further, the voltage at the node N23 must drop from VDD to VSS prior to letting the voltage level at the node N21 drop from 2VDD to VDD.

Therefore, the oscillation signal generator 111B and 121B receives the oscillation signal OSC and generates the oscillation signal NE with a width larger than a high level interval of the oscillation signal OSC to provide it to the switching control circuit 110. As shown in FIG. 10A, the oscillation signal NE is formed in a wider shape in high level than the oscillation signal OSC. If the oscillation signal NE is generated as shown in FIG. 10B, this is an error. As shown in FIG. 10C, the oscillation signal OSC is delayed by a delay part of the oscillation signal generator to secure a margin A, and further delayed by B to secure a margin behind a waveform. As a result, the margins are secured by C and B in ahead of and behind the waveform.

Figure 11A:
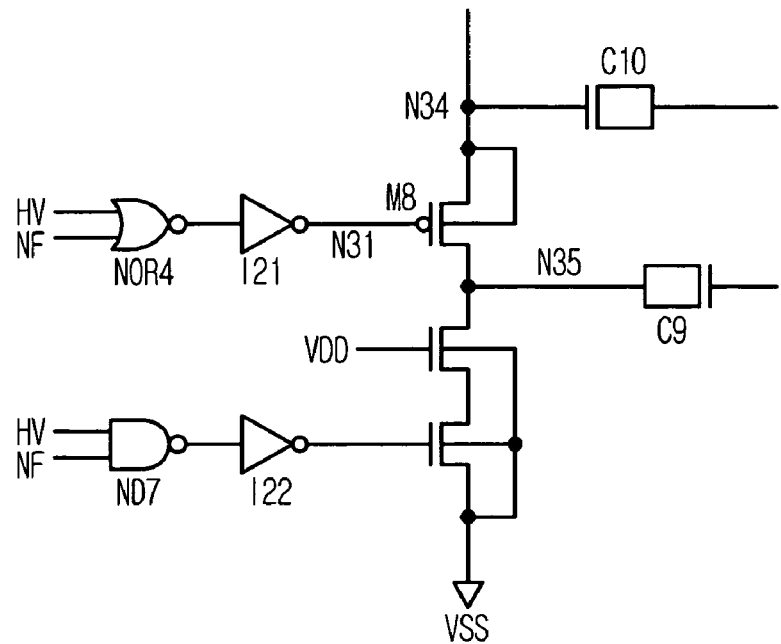
FIGS. 11A and 11B show a circuit diagram and an operation waveform diagram of the first switching control circuit shown in FIG. 7.
Figure 11B:
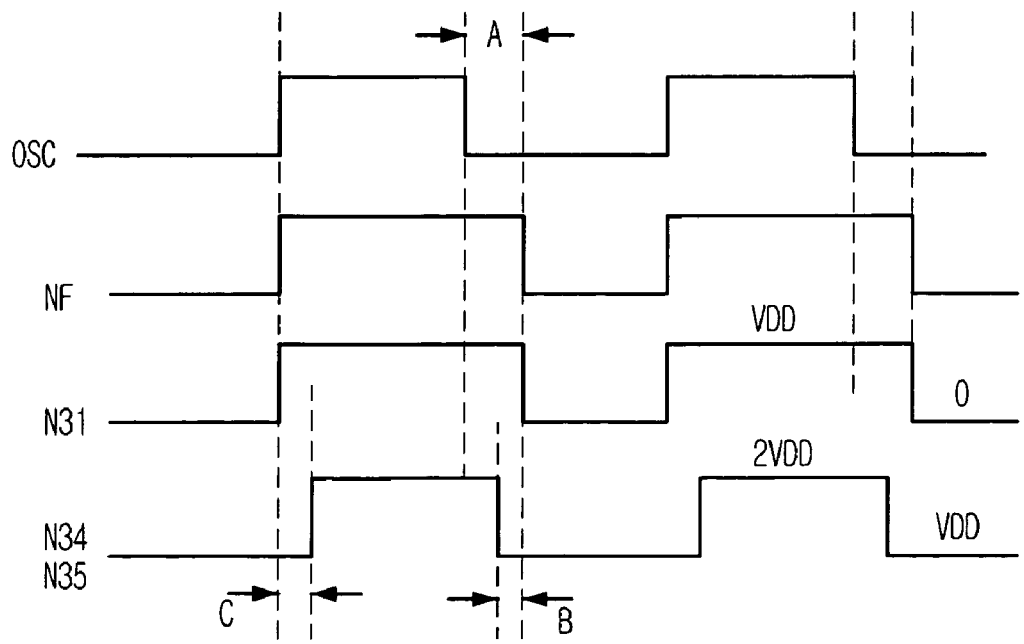

FIGS. 11A and 11B show a circuit diagram and an operation waveform diagram of the first switching control circuit 120 shown in FIG. 7, respectively. The oscillation signal NE is oscillated in an opposite phase to the oscillation signal OSC, but the oscillation signal NF is the same as the oscillation signal OSC in phase. This is because the switching control circuits 110 and 120 are operated in turn. The switching control circuit 120 is similar to the operation of the switching control circuit 110, and therefore, a detailed description thereof will be omitted here for simplicity.

Figure 12A:
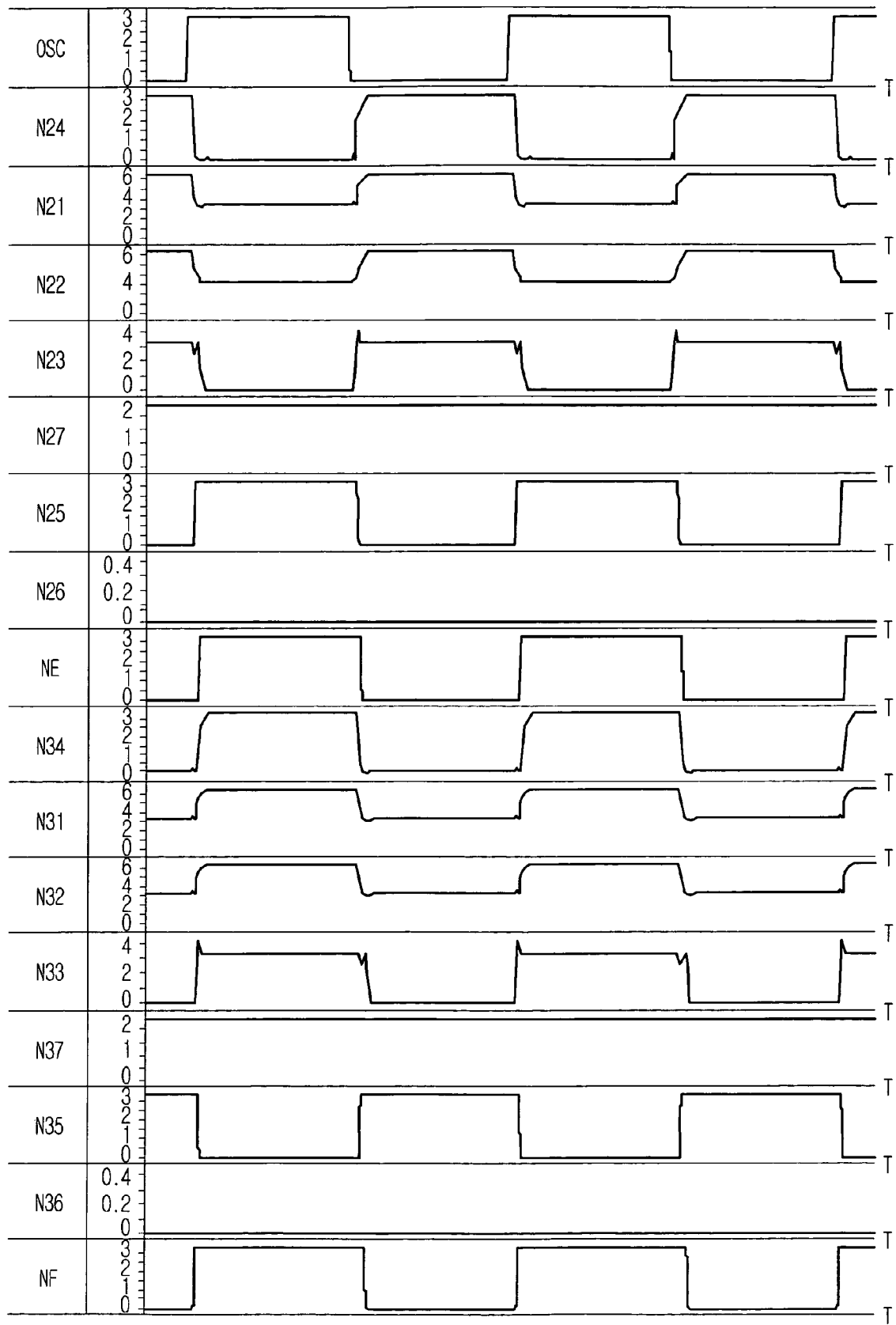
FIGS. 12A and 12B are waveforms showing the simulation results of the circuit diagram depicted in FIG. 7.
Figure 12B:
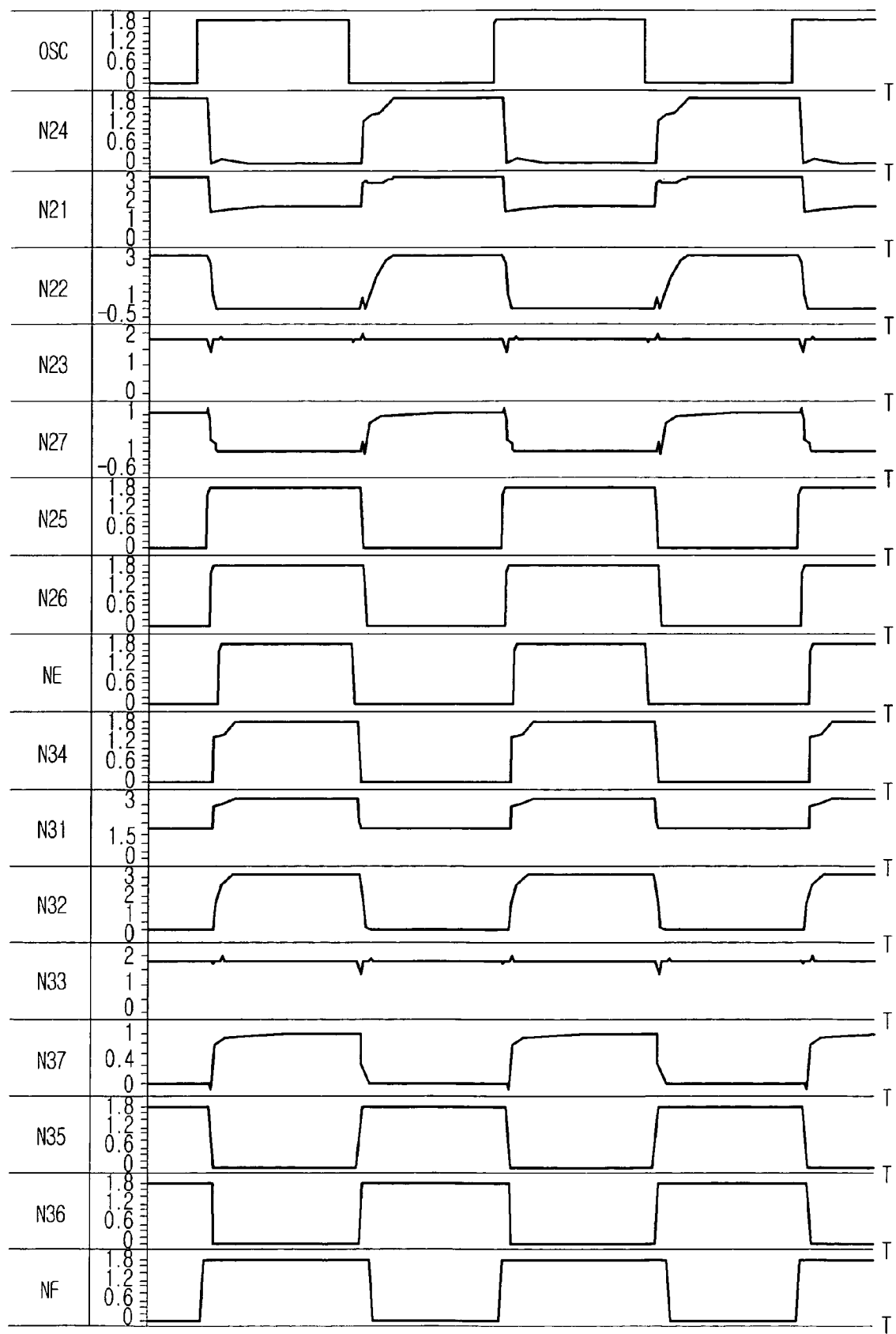

FIGS. 12A and 12B are waveforms showing the simulation results of the circuit diagram depicted in FIG. 7. That is, FIG. 12A represents a simulation result when the control signal HA is set to a logic low level, and FIG. 12B shows a simulation result when the control signal HA is set to a logic high level.

As set forth above, the present invention employs one high voltage circuit to enable it to be operated as a doubler and a tripler. Further, the high voltage circuit of the present invention can reliably provide various levels of high voltages. As a result, the semiconductor memory device using a high voltage level higher than that of a power supply voltage can be operated more reliably.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising a pumping capacitor for inducing a high voltage coupled to said pumping capacitor, a switching circuit for transferring the high voltage induced by the pumping capacitor and a switching control circuit coupled to said switching circuit,
   wherein the switching control circuit controls the switching circuit and the switching control circuit includes:
   a first capacitor for inducing a switching control voltage to a first node in response to an oscillation signal;
   a first switching MOS transistor configured between the first node and a second node for transferring the switching control voltage applied to the first node to the second node; and
   a first turn-on controller for enabling the first switching MOS transistor to be turned on, and allowing a voltage below a predetermined voltage difference to be applied between the first node and a gate of the first switching MOS transistor,
   wherein the first turn-on controller generates a reference signal which is oscillated such that a high level of the reference signal is wider than that of the oscillation signal to thereby control the turn-on operation of the first switching MOS transistor.

2. The semiconductor device as recited in claim 1, further comprising:
   a second switching MOS transistor arranged between the second node and a ground voltage;
   a second capacitor disposed between the second node and the switching circuit; and
   a second turn-on controller for allowing a voltage level below a predetermined voltage level to be applied between the first node and a gate of the second switching MOS transistor.

3. The semiconductor device as recited in claim 1, wherein the first switching MOS transistor is a PMOS transistor.

4. The semiconductor device as recited in claim 2, wherein the second switching MOS transistor is an NMOS transistor.

5. The semiconductor device as recited in claim 1, wherein the first turn-on controller includes:
   a signal generator for generating the reference signal which is oscillated in a manner that a high level of the reference is wider than that of the oscillation signal;
   a signal combiner for outputting a turn-on enable signal in response to a control signal and an enable signal; and
   a transfer circuit for transferring the reference signal to the gate of the first switching MOS transistor in response to the turn-on enable signal.

6. The semiconductor device as recited in claim 2, further comprising a third switching MOS transistor whose gate takes a power supply voltage, and which is disposed between the first and the second switching MOS transistors.

7. The semiconductor device as recited in claim 1, wherein the power supply voltage and a voltage that is twice as high as the power supply voltage are alternately applied to the first node, and the ground voltage and the power supply voltage are alternately applied to the gate of the first switching MOS transistor by the switching circuit.

8. A semiconductor device comprising a first capacitor for inducing a first high voltage, a first switching circuit for transferring the first high voltage induced by the first capacitor to a first node, a second capacitor for inducing a second high voltage to the first node, a second switching circuit for outputting the second high voltage induced by the second capacitor, a first switching control circuit for controlling the first switching circuit, and a second switching control circuit for controlling the second switching circuit,
   wherein the first switching control circuit includes:
   a third capacitor for inducing a first switching control voltage to a third node in response to an oscillation signal;
   a first switching MOS transistor for transferring the first switching control voltage applied to the third node to a second node;
   a fourth capacitor disposed between a fourth node and the switching circuit;
   a second switching MOS transistor disposed between the fourth node and a ground voltage;
   a first turn-on controller for enabling the first switching MOS transistor to be turned on, and allowing a voltage level below a predetermined voltage level to be applied between the first node and a gate of the first switching MOS transistor; and
   a second turn-on controller for allowing a voltage level less than a predetermined voltage level to be applied between the first node and a gate of the second switching MOS transistor, and
   the second switching control circuit includes:
   a fifth capacitor for inducing a second switching control voltage to the fourth node in response to the oscillation signal;
   a third switching MOS transistor for transferring the second switching control voltage applied to the fourth node;
   a sixth capacitor disposed between the fourth node and the second switching circuit;
   a fourth switching MOS transistor disposed between the fourth node and the ground voltage;
   a third turn-on controller for maintaining the third switching MOS transistor to be turned on, and allowing a voltage level below a predetermined voltage level to be applied between the third node and a gate of the third switching MOS transistor; and
   a fourth turn-on controller for allowing a voltage level below a predetermined voltage level to be applied between the third node and a gate of the fourth switching MOS transistor.

9. The semiconductor device as recited in claim 8, wherein the first turn-on controller includes:
   a signal generator for generating a reference signal which is oscillated in a manner that a high level of the reference is wider than that of the oscillation signal;
   a signal combiner for outputting a turn-on enable signal in response to a control signal and an enable signal; and
   a transfer circuit for transferring the reference signal to the gate of the first switching MOS transistor in response to the turn-on enable signal.

10. The semiconductor device as recited in claim 8, further comprising a fifth switching MOS transistor whose gate takes a power supply voltage, and which is disposed between the first and the second switching MOS transistors.

11. The semiconductor device as recited in claim 8, wherein the third turn-on controller includes:
   a signal generator for generating the reference signal which is oscillated such that a high level of the reference signal is higher than that of the oscillation signal; and
   a transfer circuit for transferring the reference signal to the gate of the third switching MOS transistor in response to a control signal.

12. The semiconductor device as recited in claim 8, further comprising a sixth switching MOS transistor whose gate takes a power supply voltage, and which is disposed between the third and the fourth switching MOS transistors.

13. The semiconductor device as recited in claim 8, wherein the power supply voltage and a voltage that is twice as high as the power supply voltage are alternately applied to the third node, and the ground voltage and the power supply voltage are alternately applied to the gate of the first switching MOS transistor.

14. A method for driving a semiconductor device comprising a capacitor for inducing a high voltage to generate the high voltage, a transfer transistor coupled to said capacitor for transferring the high voltage induced by the capacitor, a control transistor coupled to said transistor for controlling the transfer transistor, a control capacitor coupled to the control transistor and a turn-on control unit coupled to a gate of the control transistor, the method comprising the steps of:
   applying a first turn-on voltage from the turn-on control unit to the gate of the control transistor;
   applying a first voltage from the control capacitor to one terminal of the control transistor;
   applying a second turn-on voltage from the turn-on control unit having a level higher than the first turn-on voltage to the gate of the control transistor;
   boosting the first voltage applied to said one terminal of the control transistor to a second voltage;
   transferring the second voltage from the control capacitor to the other terminal of the control transistor; and
   turning on the transfer transistor by using the second voltage transferred to the other terminal of the transfer transistor,
   wherein the high levels of the first and second turn-on voltages are respectively wider than those of the first and second voltages.

15. The method as recited in claim 14, further comprising the steps of:
   dropping the second voltage applied to said one terminal of the control transistor to the first voltage; and
   applying the first turn-on voltage to the gate of the control transistor.

16. The method as recited in claim 15, wherein the first turn-on voltage is a ground voltage, both the second turn-on voltage and the first voltage are a power supply voltage, and the second voltage is twice as high as the power supply voltage.

* * * * *